United States Patent [19]

Higasitani et al.

[11] Patent Number: 5,245,205
[45] Date of Patent: Sep. 14, 1993

[54] DYNAMIC RANDOM ACCESS MEMORY HAVING A RELIABLE CONTACT

[75] Inventors: Masaaki Higasitani; Daitei Shin; Toshio Nomura, all of Kawasaki, Japan

[73] Assignee: Fujitsu Limited, Kanagawa, Japan

[21] Appl. No.: 762,117

[22] Filed: Sep. 19, 1991

[30] Foreign Application Priority Data

Sep. 20, 1990 [JP] Japan .................. 2-252497

[51] Int. Cl.⁵ .......................................... H01L 29/68
[52] U.S. Cl. ..................................... 257/296; 257/638; 257/644; 257/758
[58] Field of Search ............... 257/296, 369, 644, 650, 257/758, 759, 638; 307/530; 365/205

[56] References Cited

U.S. PATENT DOCUMENTS

| | | | |
|---|---|---|---|
| 4,775,550 | 10/1988 | Chu et al. | 437/231 |
| 4,959,704 | 9/1990 | Isomura et al. | 257/208 |
| 5,068,711 | 11/1991 | Mise | 257/380 |
| 5,155,064 | 10/1992 | Mise | 437/193 |

FOREIGN PATENT DOCUMENTS 0333426  9/1989 European Pat. Off. .
0388862  9/1990 European Pat. Off. .

OTHER PUBLICATIONS

"Planarization Process Using Spin-on-Glass", Ting et al, IEEE 4th VLSI Multilevel Interconnection Conference, Jun. 16, 1987, pp. 61-77.

Primary Examiner—Andrew J. James
Assistant Examiner—Courtney A. Bowers
Attorney, Agent, or Firm—Armstrong, Westerman, Hattori, McLeland & Naughton

[57] ABSTRACT

A dynamic random access memory comprises a memory cell region and a sense amplifier region defined on a substrate, a plurality of memory cell capacitors provided on the memory cell region in correspondence to memory cell transistors, a first insulation layer provided on the semiconductor substrate to cover both the memory cell region and the sense amplifier region, a first conductor pattern provided on the first insulation layer, an intermediate connection pattern provided on the first insulation layer in correspondence to the sense amplifier region, a spin-on-glass layer provided on the first insulation layer to extend over both the memory cell region and the sense amplifier region, and a projection part provided on the substrate of the sense amplifier region in correspondence to the intermediate connection pattern under the first insulation layer for lifting the level of the surface of the first insulation layer such that the intermediate interconnection pattern is exposed above the upper major surface of the spin-on-glass layer. The projection part includes a conductor piece formed from a same conductor material that forms an opposing electrode of the memory cell capacitor. Further, a second insulation layer is provided on the spin on glass layer to bury the first conductor pattern and the intermediate conductor pattern, and a contact hole is provided on the second insulation layer to expose the intermediate conductor pattern. The intermediate conductor pattern is connected electrically to a second conductor pattern provided on the second insulation layer via the contact hole.

6 Claims, 7 Drawing Sheets

DYNAMIC RANDOM ACCESS MEMORY HAVING A RELIABLE CONTACT

BACKGROUND OF THE INVENTION

The present invention generally relates to semiconductor memory devices and more particularly to a random access memory providing a reliable contact for interconnections.

The technique of multilevel interconnection has been used commonly in the recent semiconductor integrated circuits having increased integration density. In using such a multilevel interconnection, there is a tendency that the steps or irregularities formed on the upper surface of the multilevel interconnection tend to have an increased step height because of the large number of layers and interconnection patterns embedded in the multi-level interconnection. Thereby, such an increased step height causes various reliability problem particularly for the interconnection patterns provided on the top surface of the multilevel interconnection structure.

In order to fill the depressions and to form a planarized upper surface, the use of so-called SOG (spin-on-glass) has been proposed and used widely. In this technique, an organic solution of silicon is applied on the surface of the insulation layer and cured by evaporating the solvents. This technique, although effective in planarizing the surface of an insulator layer, tends to cause a problem of defective interconnections when the interconnection pattern such as aluminum pattern is provided in contact directly with the SOG layer. It is believed that organic vapors as well as the water vapor that are released from the SOG causes such a degradation of the contact. It should be noted that SOG generally releases volatile components even after the curing. Because of this reason, an insulation layer such as silicon oxide or PSG is provided further on the SOG layer by the CVD process to support the interconnection pattern such that the interconnection pattern is separated from the SOG layer.

In relation to such a conventional multilevel interconnection wherein an SOG layer is covered by a silicon oxide or other insulating layer for supporting the interconnection patterns, a structure is proposed in the U.S. patent application Ser. No. 495,514 now allowed and in the U.S. patent application Ser. No. 712,378 that is a divisional application of Ser. No. 495,514, wherein the assignee is the same assignee of the present invention. In this proposal, an elevating structure is formed in correspondence to the region where the contact hole is to be formed such that the surface of the insulator layer underlying the SOG layer projects upward from the upper major surface of the SOG layer. Thereby, the insulator layer underlying the SOG layer contacts directly with the insulator layer provided on the SOG layer in correspondence to the region where the contact hole is to be formed, and the SOG layer is excluded from the contact hole. In other words, the SOG layer is not exposed at the side wall of the contact hole and a reliable electric contact is achieved.

When applying this previous proposal to the DRAMs (Dynamic Random Access Memories), one has to solve various problems.

FIG.1 shows the overall construction of a conventional DRAM chip 10.

Referring to FIG.1, the surface of the DRAM chip 10 is divided into a number of generally rectangular regions by the peripheral circuits 11 that are arranged along a zone extending laterally and vertically throughout the chip 10. In the illustrated example, the zones cross with each other generally at a central part of the chip 10. In each rectangular region thus divided, a number of columnar zones 12 are provided to extend vertically in the drawing with a regular interval for accommodating the sense amplifiers S/A. Adjacent to the zones 12, memory cells (not shown specifically in FIG.1) are provided in the row and column formation to form a memory cell region.

In correspondence to each column of the memory cells, a word line WL is provided to extend vertically as shown in FIG.1. Further, in correspondence to each row of the memory cells, complementary bit lines BL and $\overline{BL}$ are provided to extend laterally as shown in FIG.1. Further, each sense amplifier in the zone 12 is connected to the sense amplifiers on the same row of other columns via a data bus line DB that extends laterally through the chip 10. The data bus line DB thereby extends in the row direction and connects the sense amplifiers S/A aligned on the same row to the peripheral circuit 11. It should be noted that there are a number of data bus lines DB extending laterally across the surface of the chip.

FIG.2 shows a typical construction of a part of the memory cell, wherein the memory cell includes a plurality of transistor T11, T13, T22, ... arranged in rows and columns. There, the transistors T11 and T13 are connected commonly to a bit line BL extending in the row direction, while the transistor T22 is connected to another, complementary bit line $\overline{BL}$. Further, each transistor is connected to a corresponding word line WL1, WL2, WL3, .... More specifically, the transistor T11 has a source connected to the bit line BL. Similarly the transistor T13 has a source connected to the same bit line BL. The transistor T22 on the other hand has a source connected to the complementary bit line $\overline{BL}$. Further, the transistors T11, T22, T13 have respective drains connected to the memory cell capacitor. The word lines WL1-WL3 are connected to the respective gates of the transistors T11, T22, T13.

FIG.3 shows the circuit diagram of the sense amplifier S/A.

Referring to FIG.3, the sense amplifier includes P-channel MOS transistors Q1 and Q3 as well as N-channel MOS transistors Q2 and Q4, wherein the transistors Q1 and Q2 are connected in series to form a first path while the transistors Q3 and Q4 are connected in series to form a second path. The sense amplifier S/A is formed by connecting the first path and the second path in parallel between a supply voltage Vcc and another supply voltage Vss.

In the sense amplifier, it will be understood that the bit line BL is connected commonly to the respective drains of the transistors Q1 and Q2 and further to respective gates of the transistors Q3 and Q4. The bit line $\overline{BL}$, on the other hand, is connected to the respective drains of the transistors Q3 and Q4, and further to the respective gates of the transistors Q1 and Q2. Thereby, the bit lines BL and $\overline{BL}$ has to cross with each other in the region of the sense amplifier S/A.

FIG.4 shows such a crossing of the bit lines BL and $\overline{BL}$ in the sense amplifier S/A. Here, the bit line BL is connected once to a conductor strip located underneath the bit line by a contact hole. As will be described later, this conductor strip is formed at the time of formation of the word line WL as a part of the conductor layer forming the word line WL. On the other hand, the complementary bit line $\overline{BL}$ extends tends over the conductor pattern, separated of course by an insulation layer not illustrated, and the crossing of the bit line BL and $\overline{BL}$ is achieved as illustrated.

FIG.5 shows a cross sectional view of the conventional DRAM including the memory cell region and the sense amplifier region, wherein the sense amplifier region shows the cross section taken along the line 5—5' of FIG.4.

Referring to FIG.5, the DRAM is constructed on a device region that is defined on the upper major surface of a silicon substrate 21 by a field oxide region 22.

As usual, a gate electrode 23 of polysilicon is provided on the device region with a gate oxide film 23a intervening between the gate electrode 23 and the upper major surface of the substrate 21, and a silicon oxide layer 24 is provided for example by the CVD process to bury the gate electrode 23 underneath. It should be noted that the gate electrode 23 is formed as a part of the word line WL that is extending through the DRAM chip 10. As shown in FIG.1, there are a number of word lines WL extending parallel, and the cross section of FIG.5 shows another word line WL that extends over the field oxide region 22.

On the silicon oxide layer 24, another silicon oxide layer 25 is provided. The silicon oxide layers 24 and 25 are formed with a contact hole that exposes the upper major surface of the substrate 21 in correspondence to a diffusion region 21a acting as a source of the memory cell transistor, and a polysilicon electrode 26 is provided to extend from the upper major surface of the diffusion region 21a along the upper major surface of the silicon oxide layer 25 to form the bit line BL. The electrode 26 extends obliquely to the plane of the drawing and shows an appearance in the illustration of FIG.5 that the electrode 26 is interrupted at an intermediate position, covering the silicon oxide layer 25 only partially. Further, the polysilicon electrode 26 is covered by a silicon oxide film 27 that buries the electrode 26 as well as the silicon oxide layer 25 underneath. On the field oxide region 22, it will be seen thereby that a consecutive deposition of the silicon oxide layers 24, 25 and 27 is made such that these layers bury the polysilicon word line WL on the field oxide region 22.

In the layered structure of layers 24, 25 and 27, there is formed a through hole 24a that exposes the upper major surface of the diffusion region 21b acting as a drain of the memory cell transistor, and there is formed a polysilicon electrode 28 that extends upward along the side wall of the through hole 24a and spreads laterally at a level above the silicon oxide layer 27 to form a stacked capacitor C characterized by a large surface area. The electrode 28 is covered by a thin dielectric film 28a such as silicon oxide (not shown), and a ground electrode 29 of polysilicon covers the fin part of the electrode 28. Between the ground electrode 29 that covers the rear or lower surface of the fin part of the electrode 28 and the upper major surface of the silicon oxide layer 27, there may be provided a silicon nitride film 30 for protecting the silicon oxide layer 27 from etching at the time of forming the fin structure.

Further, in order to provide the multi-level interconnection, an insulation layer 31 of PSG (phosphosilicate glass) or BPSG (boro-phosphosilicate glass) is provided to extend throughout the chip 10. Thus, the insulation layer 31 extends also over the sense amplifier region 12.

The structural feature and the problem of the sense amplifier region 12 will be examined later in detail.

Referring again to FIG.5, particularly the memory cell region, there are provided aluminum interconnection patterns on the insulation layer 31 with a regular interval to form a word bus line WB. Here, the word bus line WB is used for distributing the word line voltage efficiently over the memory cells on the chip and establishes a contact with the polysilicon word line at a suitable contact hole.

The word bus line WB is buried under an insulation layer 34 such as PSG or BPSG that in turn is provided on an SOG layer 35 that fills the depressed regions formed between the word bus lines WB. Thereby, the SOG layer 35 improves the planarization of the insulation layer 34. On the insulation layer 34, the data bus line DB shown in FIG.1 is provided for interconnection with the sense amplifiers.

Referring now to the sense amplifier region of FIG.5, the insulation layer 31, the SOG layer 35 and the insulation layer 34 are provided in correspondence to the memory cell region. There, an aluminum pattern 33 is provided on the insulation layer 31 in correspondence to the word bus lines WB, and the data bus line DB establishes a contact with the aluminum pattern 33 via a contact hole 34a that penetrates through the layer 34 as well as the SOG layer 35. The aluminum pattern 33 in turn is connected to the sense amplifier at a site not shown in FIG.5.

In such a conventional DRAM device, there has been a problem of unreliable contact of the data bus line DB and the aluminum pattern 33 because of the SOG layer 35 exposed at the side wall of the contact hole 34a. When the contact hole 34a is filled by aluminum, which may be conducted typically by the sputtering process, the SOG layer 35 may release the organic vapors and water due to the heating associated with the deposition and the contact between the data bus line DB and the aluminum pattern 33 may be deteriorated.

In the plan view of FIG.4, this contact hole 34a is generally formed between a pair of bit lines extending parallel with each other. As shown in the cross sectional view of FIG.5, each of the parallel bit lines includes a first conductor strip 23' that is formed simultaneously with the word line WL by patterning a common polysilicon layer, and a second conductor strip 26' that is formed simultaneously with the bit lines BL and $\overline{BL}$ by patterning a common polysilicon layer. As the aluminum pattern 33 is provided on the lowest part of the insulation layer 31 located between a pair of ridges corresponding to the polysilicon patterns 23' and 26', there occurs an accumulation of the SOG on the upper major surface of the pattern 33, and this accumulated SOG layer is exposed at the side wall of the contact hole 34a.

Now, the reason of accumulation of the SOG layer on the aluminum interconnection pattern 33 and the adverse effect of such an SOG layer are thus clarified, one may think that the problem would be eliminated by simply providing the interconnection pattern 33 not on the depressed part of the insulation layer 31 but on the projected part thereof, that is, on the part located immediately above the electrodes 23' and 26'. This solution, however, cannot be adopted, as the design rule for the polysilicon electrodes such as the electrodes 23, 23', 26, 26' is substantially more strict than the design rule of the aluminum pattern 33 as well as the word line buses WB. For example, the bit lines BL, $\overline{BL}$ and the word lines WL are patterned within the accuracy of ±0.5 μm as for the positional deviation, while the word line bus WB or data bus DB is usually patterned with the accuracy of ±1 μm. Thereby, there is no guarantee that the aluminum pattern 33 is formed exactly on the highest level part of the insulation layer 31. When failed, the accumulation of the SOG layer on the aluminum pattern 33 occurs more or less and the reliable contact cannot be achieved.

SUMMARY OF THE INVENTION

Accordingly, it is a general object of the present invention to provide a novel and useful dynamic random access memory and a fabrication process thereof, wherein the foregoing problems are eliminated.

Another and more specific object of the present invention is to provide a dynamic random access memory having an improved reliability.

Another object of the present invention is to provide a method of fabricating a dynamic random access memory with an improved yield and reduced cost.

Another object of the present invention is to provide a dynamic random access memory comprising a memory cell region and a sense amplifier region formed on a substrate, said memory cell region including a MOS transistor having a gate provided on an upper major surface of said substrate, said gate extending along the upper major surface of the substrate and forming a word line, a first diffusion region provided in said substrate adjacent to said gate as a source region and a second diffusion region provided in said substrate adjacent to said gate at a side opposite to the first diffusion region as a drain region, said memory cell region further including a bit line connected to the first diffusion region and extending along the upper major surface of the substrate at a level above the word line, a stacked capacitor structure connected to the second diffusion region and extending in an upward direction, a first insulation layer provided on said MOS transistor for burying the stacked capacitor structure underneath, said first insulation layer further burying the word lines and bit lines underneath, a first interconnection pattern provided on an upper major surface of the first insulation layer, an SOG layer provided on the first insulation layer for filling depressions formed by the first interconnection pattern, a second insulation layer provided on said SOG layer to bury the first interconnection pattern underneath, and a second interconnection pattern provided on said second insulation layer, said sense amplifier region comprising a third insulation layer corresponding to the first insulation layer of the memory region, a conductor pattern provided on an upper major surface of the first insulation layer of the sense amplifier region, an SOG layer provided on the upper major surface of the third insulation layer for filling depressions formed on the upper major surface of the third insulation layer, a fourth insulation layer provided on the SOG layer of the sense amplifier region to bury said conductor pattern underneath, a projection member provided under the third insulator layer for raising the level of the upper major surface of the third insulator layer such that an upper major surface of the conductor pattern is exposed above the SOG layer, said fourth insulator layer thereby covering the exposed upper major surface of the conductor pattern directly, a contact hole provided in the fourth insulator layer in correspondence to the conductor pattern for exposing the upper major surface of the conductor pattern, and a third interconnection pattern provided on the upper major surface of the fourth insulator layer in contact with the conductor pattern via said contact hole. According to the present invention, one can exclude the SOG layer at the part where the contact hole is to be formed. In other words, the fourth insulation layer is contacted directly on the upper major surface of the conductor pattern 33 as a result of the lifting of the conductor pattern that in turn is caused by the projection member, and the SOG layer 35 is eliminated from the contact hole 34a. Thereby, the reliability of the contact and hence the reliability of the memory device is increased.

Other objects and further features of the present invention will become apparent from the following detailed description when read in conduction with the attached drawings.

DETAILED DESCRIPTION

Figure 5:
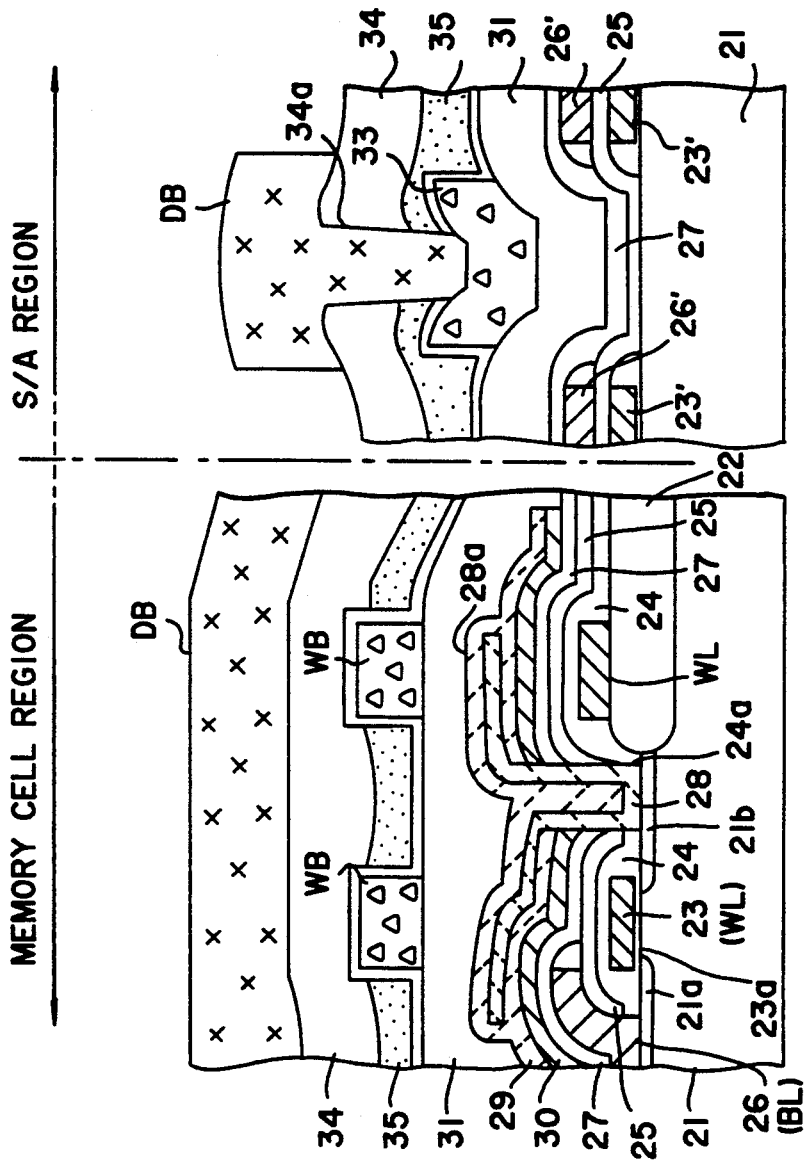
FIG. 5 is a cross sectional view for showing the conventional DRAM chip including the memory cell region and the sense amplifier region.
Figure 6:
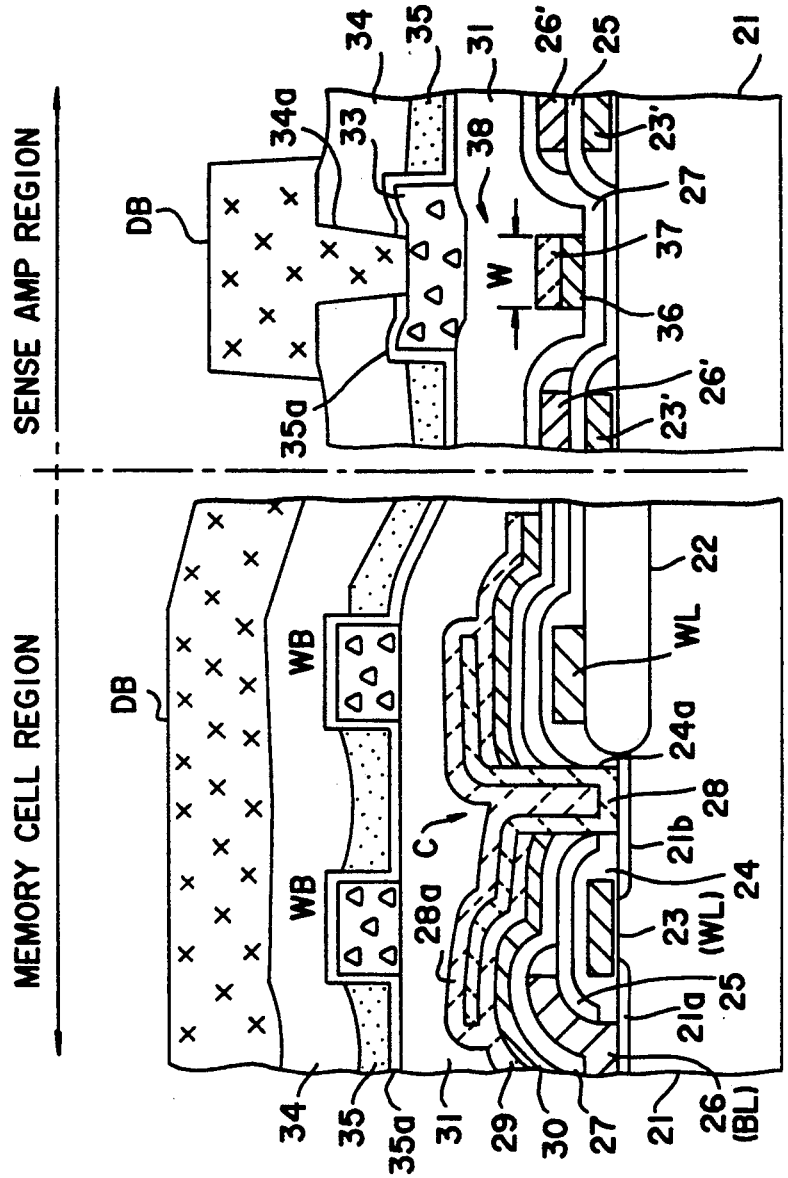
FIG. 6 is a cross sectional view corresponding to FIG. 5 for showing a DRAM chip according to an embodiment of the present invention.

FIG. 6 shows an embodiment of DRAM according to the present invention. In FIG. 6, the parts that correspond to those parts already described with reference to FIG. 5 are designated by the same reference numerals and the description will not be repeated.

Referring to FIG. 6, there is provided a projection structure 38 formed of a silicon nitride pattern 36 and a polysilicon pattern 37 on the depressed upper major surface of the silicon oxide layer 27, wherein the silicon nitride pattern 36 is provided directly on the depressed upper major surface of the silicon oxide layer 27 and the polysilicon pattern 37 is provided on the silicon nitride pattern 36. As will be described hereinbelow, the silicon nitride pattern 36 is formed from the same silicon nitride film that forms the silicon nitride film 30 of the stacked capacitor C. As is commonly practiced, this silicon nitride film 30 is used for the etching stopper at the time of forming a space under the polysilicon fin of the electrode 28 for the electrode 29 that fills the space. In the conventional device, this silicon nitride film has been removed after the formation of the electrode 29 except for the film 30 that is located under the electrode 29.

Similarly, the polysilicon pattern 37 on the silicon nitride pattern 36 is formed from the same polysilicon film that forms the electrode 29 of the stacked capacitor C. In the conventional device, this polysilicon layer 37 has been removed by etching after the formation of the electrode 28.

Generally, the patterns 36 and 37 are formed with the accuracy or design rule used for forming the word lines WL and the bit lines BL. Thereby, the patterns 36 and 37 typically have a width W of about 1.5 μm. With such a strict design rule applied, it is easy to form the patterns 36 and 37 exactly in correspondence to the depression formed on the upper major surface of the silicon oxide layer 27.

With the provision of the projection structure 38, the insulation layer 31 that buries the projection structure 38 underneath shows a substantially flat upper major surface in spite of the fact that there is a depression in the silicon oxide layer 27. In response thereto, the position of the aluminum conductor pattern 33 provided on the insulation layer 31 is moved upward and the top surface of the pattern 33 is exposed above the insulation layer 35.

As already noted, the pattern 33 is formed with a less strict design rule and the pattern 33 may not be formed at the exact position as shown in FIG.6. However, such a lateral deviation in the pattern 33 does not cause problem at all, as the surface of the insulation layer 31 is substantially flat and the upper surface of the conductor pattern 33 is exposed above the SOG layer irrespective of where the pattern 33 is provided.

With the upper major surface of the conductor pattern 33 thus exposed above the upper major surface of the SOG layer, the insulation layer 34 makes a direct contact with the exposed upper major surface of the conductor pattern 33. Thus, the SOG layer 35 is excluded from the contact hole 34a that is provided on the insulator layer 34 to expose the upper major surface of the conductor pattern 33, and a reliable electric contact can be established between the data bus DB and the conductor pattern 33.

In the structure of FIG.6, a thin insulation film 35a of BPSG may be formed to cover the aluminum patterns WB or 33 for preventing the formation of hilloks. This BPSG layer 35a has an extremely limited thickness and does not influence the effectiveness of the structure of FIG.6. Anyway, the contact hole 34a is formed to penetrate through this thin BPSG layer 35a.

Next, the fabrication process of the present invention will be described with reference to FIGS.7(A)-7(F).

Figure 1:
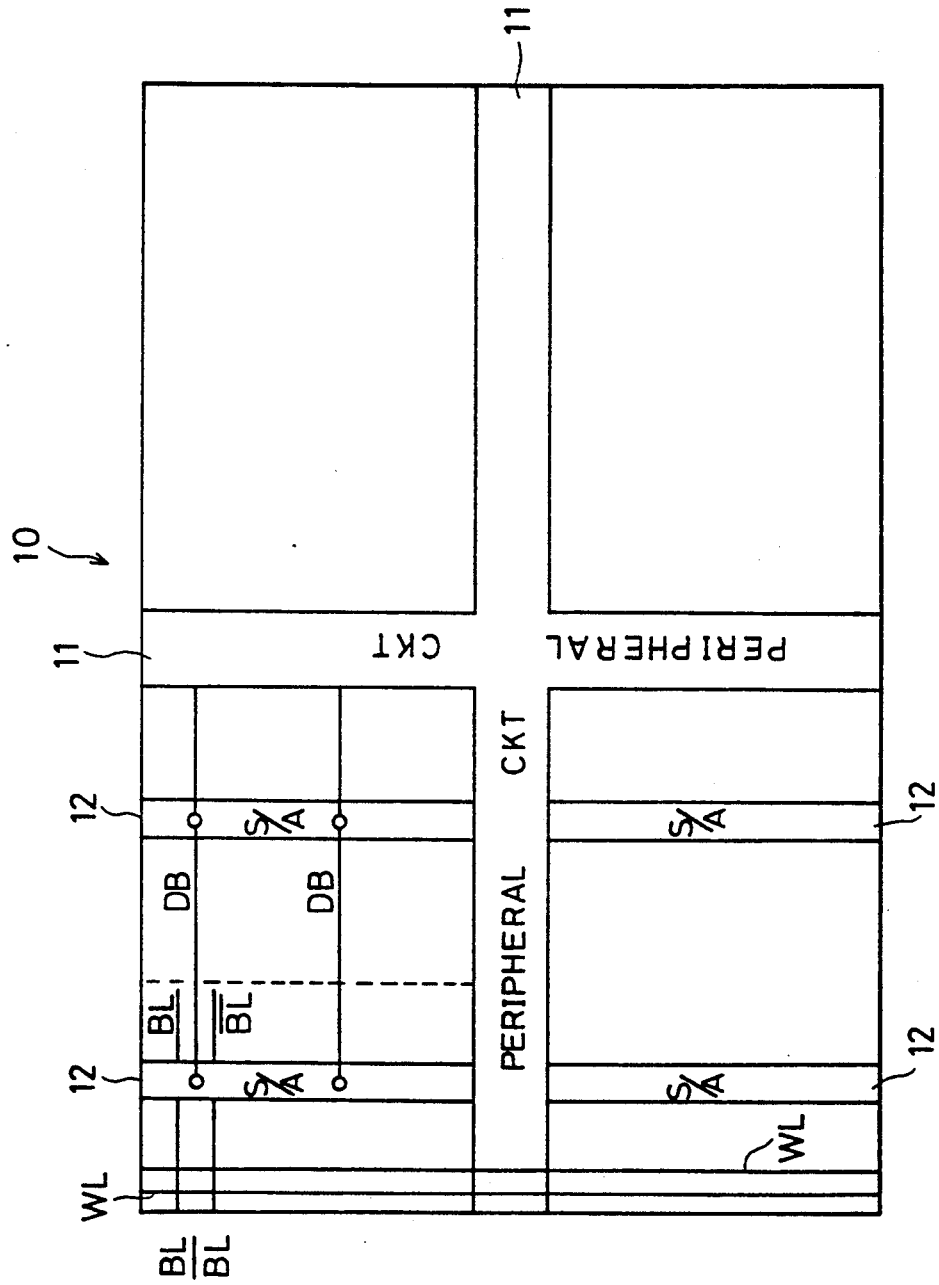
FIG. 1 is a plan view for showing an overall structure of a conventional DRAM chip.
Figure 2:
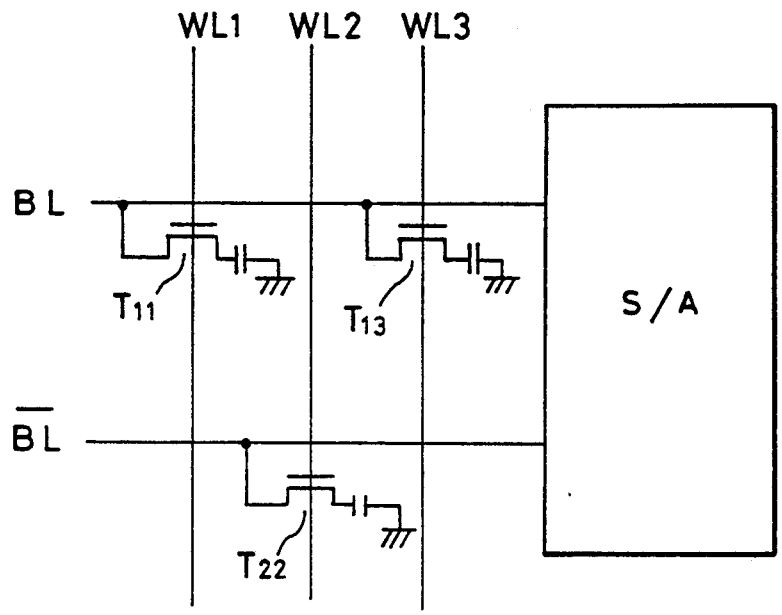
FIG. 2 is a circuit diagram showing the circuit of a memory cell used in the DRAM chip of FIG. 1.
Figure 3:
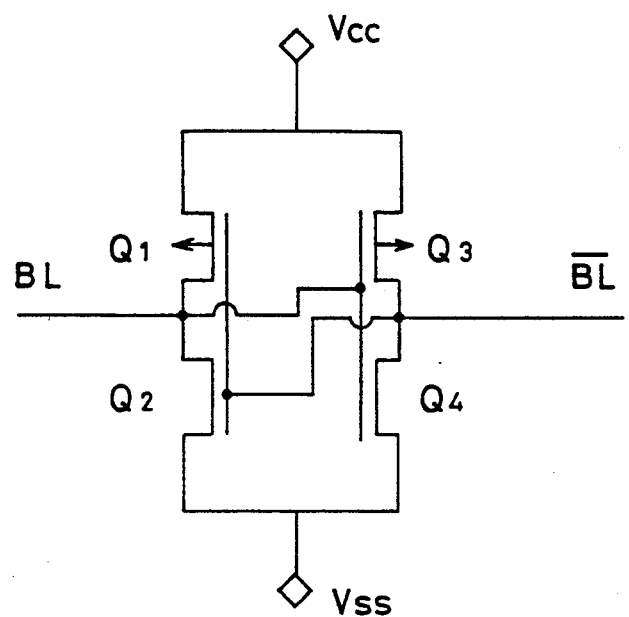
FIG. 3 is a circuit diagram showing the circuit of a sense amplifier used in the DRAM chip of FIG. 1.
Figure 4:
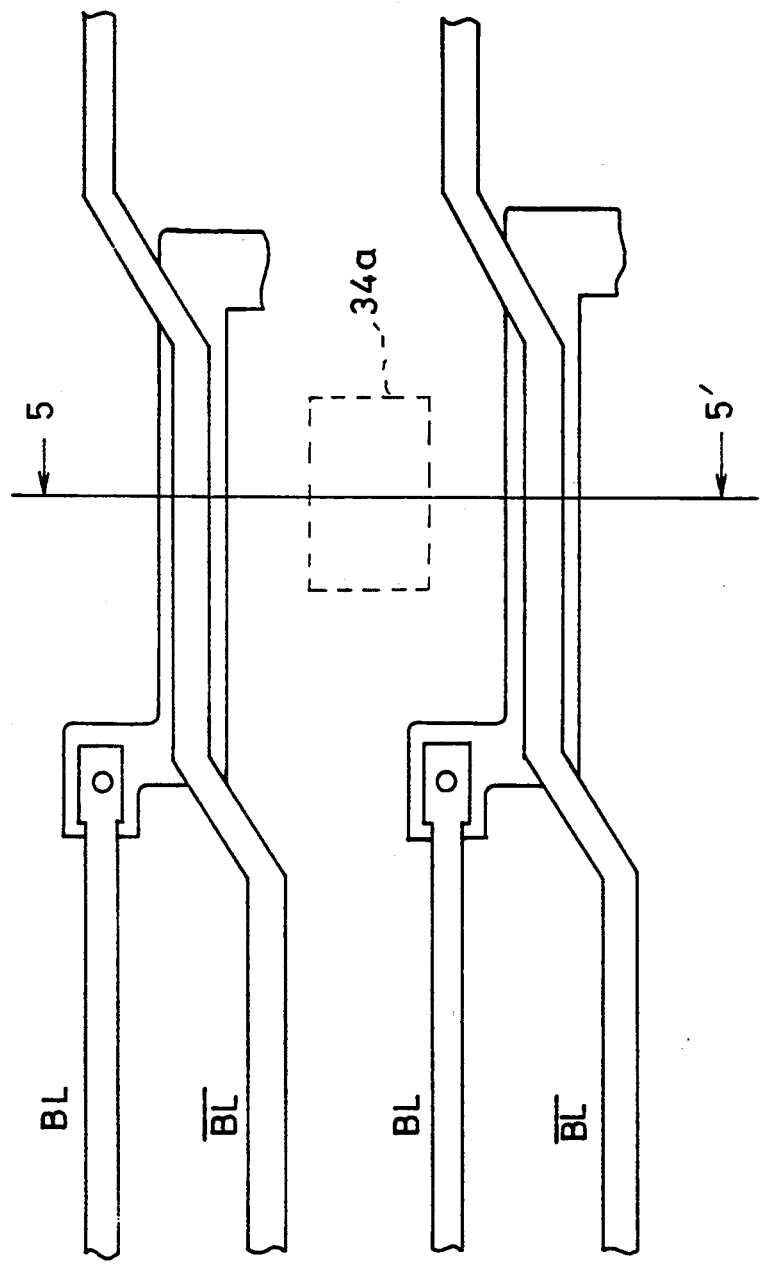
FIG. 4 is a plan view showing a pattern of conductors formed in a sense amplifier on the DRAM chip of FIG. 1.
Figure 7A:
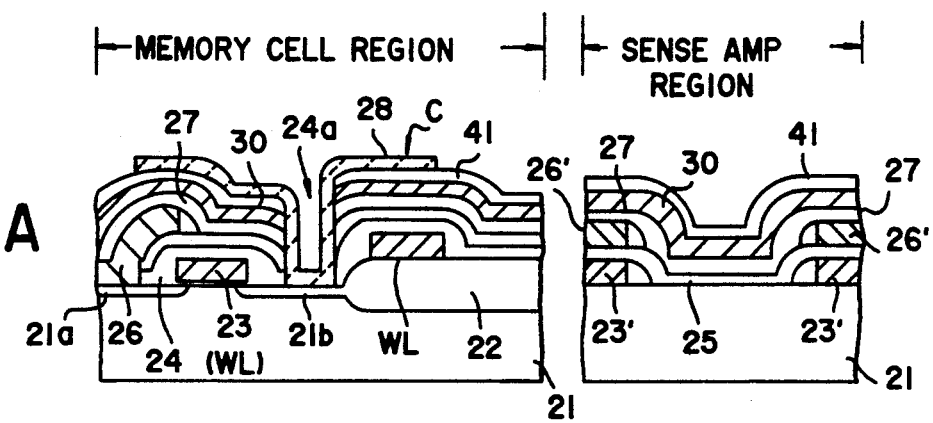
FIGS. 7(A)–7(F) are diagrams showing the process for fabricating the structure of FIG. 6.

Referring to FIG.7(A), a field oxide region 22 is formed on the upper major surface of the silicon substrate 21 by the LOCOS process to define a device region. It should be noted that the device region is formed in the memory cell region defined in FIG.1.

After the LOCOS process is completed, the exposed upper major surface of the silicon substrate 21 is covered with a thin silicon oxide film, and the word lines WL of polysilicon are formed on the substrate to extend generally parallel with each other over the device region by a predetermined pitch, by depositing a polysilicon layer (not shown) and patterning the same subsequently. The word line WL forms the gate electrode 23 in the device region and establishes a contact to the upper major surface of the silicon substrate 21 via the thin oxide film formed previously. This oxide film acts as the gate oxide film. Further, using the gate electrode 23 as the mask, an ion implantation process is conducted to form the source region 21a and the drain region 21b in the substrate at both sides of the gate electrode 23.

It should be noted that the patterning of the polysilicon layer is achieved simultaneously in the sense amplifier region shown at the right of FIG.7(A) as well as in the memory cell region shown at the left. Thereby, the polysilicon patterns 23' are formed on the upper major surface of the substrate 21 simultaneously to the word lines WL from the same polysilicon layer that have formed that word line WL and the gate electrode 23. There, the patterns 23' are separated from the upper major surface of the substrate 21 by the thin silicon oxide film that was formed to cover the entire exposed surface of the substrate 21 after the LOCOS process has been accomplished, as already described.

After the word lines WL and the pattern 23' thus formed, the silicon oxide layer 24 is deposited by the CVD process to bury the word lines WL including the gate electrode 23 of the memory cell region and the pattern 23' of the sense amplifier region. Further, another silicon oxide layer 25 is deposited on the silicon oxide layer 24, and another polysilicon layer (not shown) is deposited further on the layer 25 after forming a contact hole exposing the source region 21a of the MOS transistor. By patterning the second polysilicon layer, the bit lines 26 are formed in contact with the source region 21a. Simultaneously, the silicon patterns 26' are formed on the insulator layer 25 from the same second polysilicon layer. In the illustrated example, the silicon oxide layer 24 is removed from the region above the polysilicon pattern 23' of the sense amplifier region. Thereby, the silicon oxide layer 25 directly covers the pattern 23' and the upper major surface of the substrate 21.

After formation of the bit lines 26 and the polysilicon patterns 26', the silicon oxide layer 27 is deposited by the CVD process to cover the entire structure. Further, the silicon nitride film 30 is deposited for example by the sputtering process uniformly over the memory cell region and the sense amplifier region. Further, a silicon oxide layer 41 is deposited on the silicon nitride film 30 uniformly over the memory cell region and the sense amplifier region.

Next, a contact hole 24a is provided through the layers 24, 25, 27, 30 and 41 to expose the drain region 21b of the memory cell transistor. Further, a polysilicon layer 28 is deposited on the silicon oxide layer 41 including the contact hole 24a to achieve a direct contact with the exposed drain region 21b of the memory cell transistor. The polysilicon layer 28 is then patterned such that the layer 28 exists only in the vicinity of the contact hole 28. Thereby, the structure of FIG.7A is obtained.

Figure 7B:
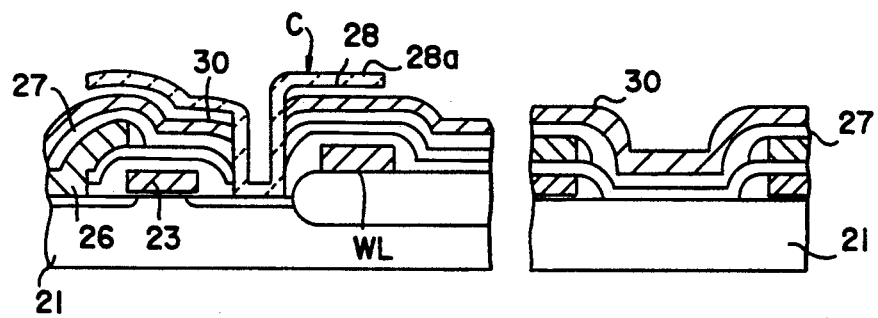

Next, in the step of FIG.7(B), the silicon oxide layer 41 is removed by etching while using the silicon oxide film 30 as an etching resistant mask. An etching solution of hydrofluoric acid may be used for this purpose. As a result, the fin-shaped electrode 28 is obtained. Further, a silicon nitride film 28a is deposited on the exposed surface of the electrode 28 by the CVD process as the dielectric film of the memory cell capacitor C.

Figure 7C:
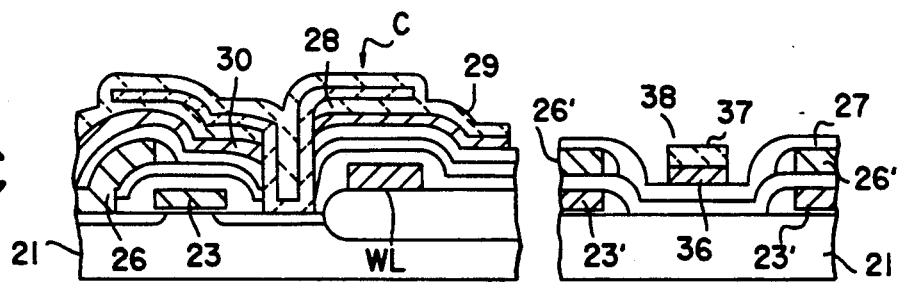

In the step of FIG.7(C), a polysilicon layer 29 is deposited to bury the electrode 28, including the space formed under the fin-shaped part of the electrode 28. Thereby, the space is filled by the polysilicon layer 29 as shown in FIG.7(C). The polysilicon layer 29 is deposited uniformly over the chip and hence covers the silicon nitride film 30 in correspondence to the sense amplifier region. Further, in the step of FIG. 7(C), the silicon nitride film 30 and the polysilicon layer 29 on the sense amplifier region are patterned to form the silicon nitride pattern 36 and the polysilicon pattern 37. As noted previously, this patterning is achieved in accordance with the strict design rule that is employed to the patterning of the word lines and bit lines. Thus one can form the projection structure 38 exactly in correspondence to the depression formed between the pair of ridges of the polysilicon patterns 23' and 26'. The polysilicon pattern 37 forming the projection structure 38 has a thickness an composition that correspond to the thickness and composition of the polysilicon layer 29. Generally, the thickness of the polysilicon layer 37 is about 150 nm while the thickness of the silicon nitride layer 36 is about 50 nm.

Figure 7D:
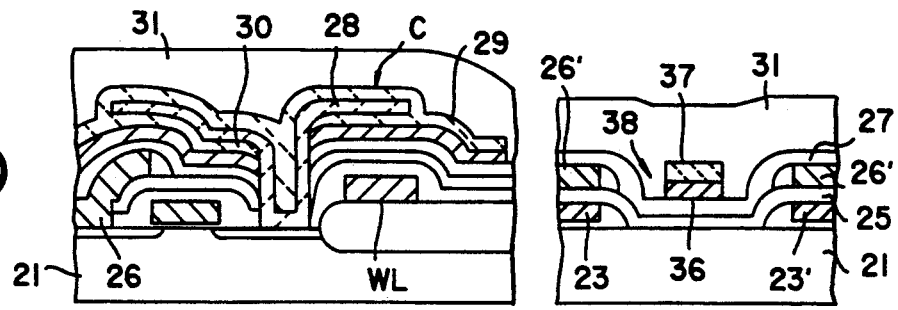
Figure 7E:
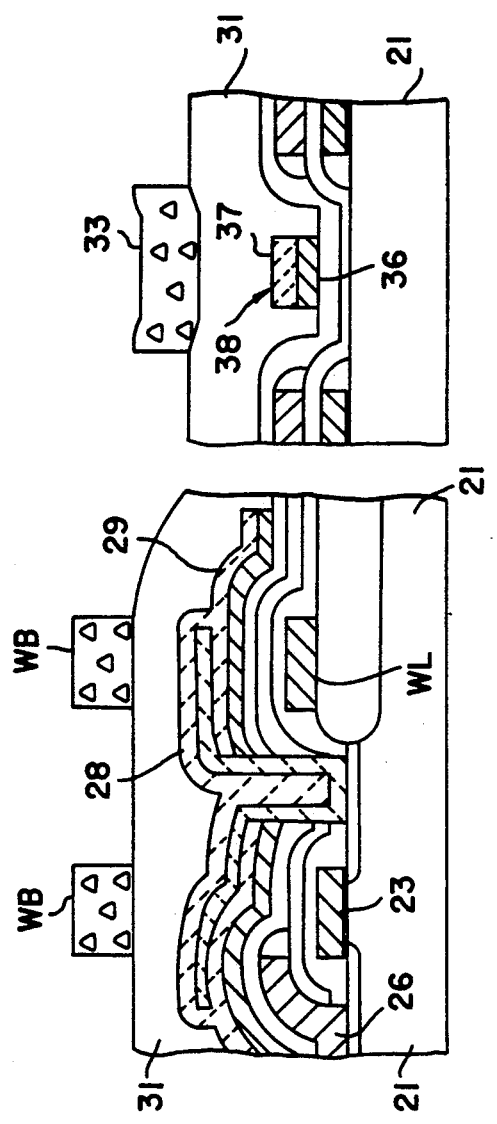

After the structure of FIG.7(C) is completed, the entire structure is covered by a BPSG layer 31 including both the memory cell region and the sense amplifier region as shown in FIG.7(D), and aluminum electrodes WB or 33 are provided on the planarized upper major surface of the BPSG layer 31 as shown in FIG.7(E). In forming the structure of FIG.7(E), an aluminum layer is deposited on the BPSG layer 31 by sputtering and patterned subsequently. When patterning such interconnection layers formed above the level of the device itself, a less strict design rule is applied for facilitating the fabrication and improving the throughput. Thereby, the pattern 33 may have a width of about 3 $\mu$m or more. As already described previously, the conventional structure of FIG.5 has caused the problem of unreliable or unpredictable formation of the pattern 33 particularly about the level of the upper surface of the pattern 33, because of the depression formed on the upper surface of the layer 31. In the structure of FIG.7(E), it will be understood that the level of the pattern 33 is substantially the same even when the position of the pattern 33 is deviated laterally because of the less strict design rule.

Figure 7F:
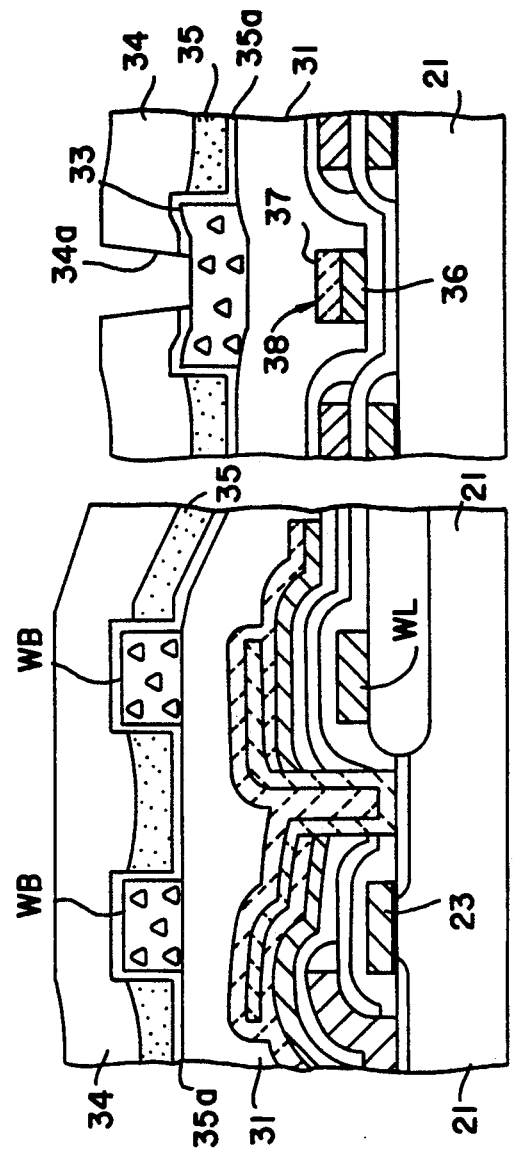

In the step of FIG.7(F), the thin BPSG layer 35a is deposited uniformly over the structure of FIG.7(E) and the SOG layer 35 is applied further thereon with a depth set such that the upper major surface of the aluminum patterns WB or 33 is exposed above the surface of the SOG layer 35. As noted above, the exposure of the upper major surface of the aluminum pattern 33 above the SOG layer 35 is guaranteed because of the existence of the projection structure 38 underneath.

After curing the SOG layer 35 by evaporating the solvents, the BPSG layer 34 is deposited on the entire structure to bury the aluminum patterns underneath. After the layer 34 is deposited, a contact hole 34a is provided in correspondence to the aluminum pattern 33 to expose the upper major surface of the pattern 33. As the upper major surface of the pattern 33 is located above the SOG layer 35, there is no SOG layer exposed by the contact hole 34a. In other words. the electrode that is contacted with the aluminum pattern 33 via the contact hole 34a establishes a reliable and firm electric contact.

In the above fabrication process, it may be possible to form the projection structure 38 by using a part of the polysilicon layer that forms the capacitor electrode 28. In this case, however, the silicon oxide layer 41 is inevitably interposed between the polysilicon pattern and the underlying silicon nitride pattern 36, and the depression of the sense amplifier region may be excessively compensated.

Preferably, the overall thickness of the projection structure 38 may be set to 200 nm in correspondence to the thickness of the bit line and the insulation film 27. Further, the silicon nitride pattern 36 underlying the polysilicon pattern 37 may be eliminated depending on the fabrication process of the memory cell capacitor.

Further the present invention is not limited to the embodiments described heretofore, but various variations and modifications may be made without departing from the scope of the invention.

What is claimed is:
1. A dynamic random access memory, comprising:
a semiconductor substrate having upper and lower major surfaces;
a memory cell region defined on the upper major surface of the substrate for accommodating memory cell transistors;
a sense amplifier region defined on the upper major surface of the substrate for accommodating sense amplifiers;
a plurality of memory cell transistors provided on said memory cell region;
a plurality of memory cell capacitors provided on said memory cell region in correspondence to each memory cell transistor, each of said memory cell capacitors comprising a first electrode connected electrically to a corresponding memory cell transistor for storing electric charges and a second, opposing electrode separated from the first electrode by a dielectric film;
a sense amplifier provided on said sense amplifier region, said sense amplifier being connected for detecting electric charges stored in the memory cell capacitor;
a first insulation layer having upper and lower major surfaces and provided on the upper major surface of the semiconductor substrate to cover both the memory cell region and the sense amplifier region, said first insulation layer burying the memory cell capacitors and memory cell transistors underneath the lower major surface thereof;
a first conductor pattern provided on the upper major surface of the first insulation layer for carrying electric signals;
an intermediate connection pattern provided on the upper major surface of the first insulation layer in correspondence to said sense amplifier region for carrying electric signals, said intermediate connection pattern having upper and lower major surfaces;
a spin-on-glass layer having upper and lower major surfaces and provided on the upper major surface of the first insulation layer to extend over both the memory cell region and the sense amplifier region, said spin-on-glass layer covering a part of the upper major surface of the first insulation layer that is not covered by the first conductor pattern or by the intermediate connection pattern;
a projection part having upper and lower major surfaces and surrounded by a side wall, said projection part being provided on the sense amplifier region in correspondence to the intermediate connection pattern, said projection part being provided below the upper major surface of the first insulation layer such that the lower major surface of the projection part is coincident to the lower major surface of the first insulation layer for lifting the level of the upper major surface of the first insulation layer such that the upper major surface of the intermediate connection pattern is exposed above the upper major surface of the spin-on-glass layer, said projection part comprising a conductor piece formed from a same conductor material that forms the opposing electrode of the memory cell capacitor;
a second insulation layer having upper and lower major surfaces and provided on the upper major surface of the spin-on-glass layer to bury the first conductor pattern and the intermediate conductor connection pattern, said second insulation layer having the lower major surface establishing a contact with the upper major surface of the intermediate connection pattern;

a contact hole provided on the second insulation layer to extend from the upper major surface to the lower major surface for exposing the upper major surface of the intermediate connection pattern; and second conductor pattern provided on the upper major surface of the second insulation layer, said second conductor pattern filling said contact hole and establishing an electric contact with the intermediate connection pattern.

2. A dynamic random access memory as claimed in claim 1 in which said conductor piece forming the projection part has a composition and thickness identical with those of the opposing electrode of the memory cell capacitor.

3. A dynamic random access memory as claimed in claim 1 in which said memory cell capacitor further comprises a silicon nitride film under the opposing electrode, and said projection part further comprises a silicon nitride piece located under said conductor piece in correspondence to said silicon nitride film.

4. A dynamic random access memory as claimed in claim 1 in which said sense amplifier region carries a plurality of projecting structures each having an upper major surface projected upward from the upper major surface of the substrate, and said projection part is provided in correspondence to a space between said projecting structures.

5. A dynamic random access memory as claimed in claim 4 in which said memory cell region further comprises word lines and bit lines connected to the memory cell transistors, and said projecting structure of the sense amplifier region includes first and second conductor strips stacked with each other on the upper major surface of the substrate in correspondence to the sense amplifier region with an insulator layer interposed therebetween, said fist conductor strip having a thickness and a composition identical with those of the word lines while said second conductor strips having a thickness and a composition identical with those of the bit lines.

6. A dynamic random access memory as claimed in claim 5 in which said first and second conductor strips act as complementary bit lines, and said projecting structure of the sense amplifier region provides a crossing of the complementary bit lines.

* * * * *